(12) United States Patent
Edwards

(10) Patent No.: US 6,498,438 B1
(45) Date of Patent: Dec. 24, 2002

(54) CURRENT SOURCE AND DISPLAY DEVICE USING THE SAME

(75) Inventor: Martin J. Edwards, Crawley (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 73 days.

(21) Appl. No.: 09/671,908

(22) Filed: Sep. 28, 2000

(30) Foreign Application Priority Data

Oct. 7, 1999 (GB) ............................................. 9923591

(51) Int. Cl.[7] ................................................ G09G 3/10
(52) U.S. Cl. ...................... 315/169.3; 313/504; 313/506
(58) Field of Search .......................... 315/169.1, 169.3; 313/504, 506, 509; 345/82, 204, 209

(56) References Cited

U.S. PATENT DOCUMENTS

| | | | | |
|---|---|---|---|---|
| 4,550,274 A | * | 10/1985 | Weber ...................... | 315/169.4 |
| 5,670,972 A | | 9/1997 | Utsugi et al. .................. | 257/59 |
| 5,751,263 A | * | 5/1998 | Huang et al. .................. | 345/82 |
| 5,821,923 A | * | 10/1998 | Van Amesfoort et al. ...... | 315/169.3 |
| 5,952,789 A | | 9/1999 | Stewart et al. ........... | 315/169.4 |

FOREIGN PATENT DOCUMENTS

| | | | | |
|---|---|---|---|---|
| EP | 0653741 A1 | 5/1995 | ............ | G09G/3/30 |
| EP | 0717446 | 6/1996 | ........... | H01L/27/15 |
| WO | WO9636959 | 11/1996 | ............ | G09G/3/30 |

* cited by examiner

Primary Examiner—Don Wong
Assistant Examiner—Jimmy T. Vu
(74) Attorney, Agent, or Firm—Aaron Waxler

(57) ABSTRACT

A display device comprises an array of pixels arranged in rows and columns, each pixel comprising a current-driven display element, for example an electroluminescent display element. Driver circuitry is provided for producing current signals for driving the display elements. The driver circuitry generates a voltage function and supplies it to the input of a binary weighted capacitor network, each capacitor of the network being connected in series with a respective switching transistor. An input word to the driver circuitry controls the switching of the switching transistors, such that the output current of the driver circuitry is a function of the voltage function and of the combined capacitance of the capacitors of the network for which the associated switching transistor is closed. The output current is supplied to a selected pixel of the array. The rate of change of voltage across the capacitors is independent of the voltage drop across the switching transistors so that non-uniformity between different switching transistors will be of no consequence.

8 Claims, 10 Drawing Sheets

CURRENT SOURCE AND DISPLAY DEVICE USING THE SAME

BACKGROUND OF THE INVENTION

The invention relates to a current source, which may, for example, be used as part of the control circuitry for display devices, and particularly display devices having current-driven pixels, for example active matrix electroluminescent display devices. Such display devices comprise an array of electroluminescent display pixels arranged in rows and columns, and the invention also relates to display devices using such current sources.

SUMMARY OF THE INVENTION

Matrix display devices employing electroluminescent, light-emitting, display elements are well known. The display elements may comprise organic thin film electroluminescent elements, for example using polymer materials, or else light emitting diodes (LEDs) using traditional III-V semiconductor compounds. Recent developments in organic electroluminescent materials, particularly polymer materials, have demonstrated their ability to be used practically for video display devices. These materials typically comprise one or more layers of a semiconducting conjugated polymer sandwiched between a pair of electrodes, one of which is transparent and the other of which is of a material suitable for injecting holes or electrons into the polymer layer.

The polymer material can be fabricated using a CVD process, or simply by a spin coating technique using a solution of a soluble conjugated polymer. Organic electroluminescent materials exhibit diode-like I-V properties, so that they are capable of providing both a display function and a switching function, and can therefore be used in passive type displays. Alternatively, these materials may be used for active matrix display devices, with each pixel comprising a display element and a switching device for controlling the current through the display element. Examples of an active matrix electroluminescent display are described in EP-A-0653741 and U.S. Pat. No. 5,670,792, the contents of which are incorporated herein by way of reference material.

A problem with display devices of this type arises from the fact that they have current driven display elements. Conventional supply circuitry for supplying a controllable current to the display elements can suffer the drawback that the current varies as a function of the electrical characteristics of the switching transistors used in the supply circuitry. For example, a current controlling transistor may be provided as part of the pixel configuration, with the gate voltage supplied to the transistor determining the current through the display element. Different transistor characteristics give rise to different relationships between the gate voltage and the source-drain current. Such an arrangement is described in EP-A-0653741.

The current controlling circuitry may either comprise part of the pixel configuration, as described above, so that a pixel voltage is supplied to the pixels, or else the current controlling circuitry may comprise separate circuitry provided at the periphery of the display area, so that a pixel current is supplied to the pixels. In either case, if the current controlling circuitry is integrated onto the same substrate as the display pixels, it typically comprises thin film switching elements such as thin film transistors. The uniformity across the substrate of the electrical characteristics of the switching elements may be poor, which gives rise to unpredictable variations in the pixel currents and therefore the pixel outputs.

According to the invention, there is provided a display device comprising:
an array of pixels arranged in rows and columns, each pixel comprising a current-driven display element;
driver circuitry for generating signal currents corresponding to desired outputs from the display elements, characterised in that the driver circuitry comprises means for generating a predetermined voltage function, the voltage function being supplied to the input of a binary weighted capacitor network, each capacitor of the network being connected in series with a respective switching transistor, an input word to the driver circuitry controlling the switching of the switching transistors, such that the output current of the driver circuitry is a function of the voltage function and of the combined capacitance of the capacitors of the network for which the associated switching transistor is closed, the output current being supplied to a selected pixel of the array.

The current output of this arrangement depends upon the voltage across the capacitors of the network, and the combined capacitance. In particular, the current through each capacitor is a function of the rate of change of voltage across the capacitor. The currents through each capacitor having a closed switch are summed to provide the current output. The voltage across each capacitor depends on the voltage function, and can be substantially independent of the characteristics of the switching transistors. In particular, the voltage across the switching transistors (i.e. the source-drain voltage) will become constant once the transistors have saturated, so that the rate of change of voltage across the capacitors is then independent of the voltage drop across the switching transistors. Therefore, non-uniformity between different switching transistors will be of no consequence.

The voltage function may comprise a ramp function, so that a constant current through the capacitors results (after an initial settling period). However, other functions may be used, which may be selected to give an output current which itself has a desired function over time.

The display device preferably further comprises row addressing circuitry for addressing rows of the array in turn, and the driver circuitry comprises a binary weighted capacitor network for each column of the array, and provides a respective signal current to each column during a row addressing period.

Each pixel may comprise first and second switching means, and may be operable in a first mode in which the input current is supplied by the first switching means to the second switching means, a control level being stored for the second switching means corresponding to the input current, and in a second mode in which the stored control level is applied to the second switching means so as to drive a current corresponding to the input current through the display element. The display element is preferably an electroluminescent display element. By using the current supplied by the driver circuitry to configure the pixel, this pixel is made to mirror the input current.

The second switching means may then comprise a TFT, and the gate-source voltage of the TFT at an operating point in which the source-drain current is the input current is stored on a capacitor as the control level.

The output current may be sampled to control a current source, rather than being supplied directly to the pixel. The current source then supplies the current to the selected pixel of the array. This avoids the need to apply a constantly increasing voltage as the voltage function for the full duration of the row address period.

The invention also provides a current source for providing a current output based on a binary input control word, comprising:

a binary weighted capacitor network; and means for generating a predetermined voltage function, the voltage function being supplied to the input of the binary weighted capacitor network, wherein each capacitor of the network is connected in series with a respective switching transistor, the binary input word controlling the switching of the switching transistors, such that the output current of the driver circuitry is a function of the voltage function and of the combined capacitance of the capacitors of the network for which the associated switching transistor is closed, the output current being supplied to an output of the current source.

This current source may be used in the display device of the invention, but it may also be used in other applications requiring a constant current input.

BRIEF DESCRIPTION OF THE DRAWINGS

Embodiments of display devices in accordance with the invention will now be described, by way of example, with reference to the accompanying drawings in which.

The figures are merely schematic and have not been drawn to scale.

DESCRIPTION OF THE PREFERRED EMBODIMENTS

The same reference numbers are used throughout the figures to denote the same or similar parts.

Figure 1:
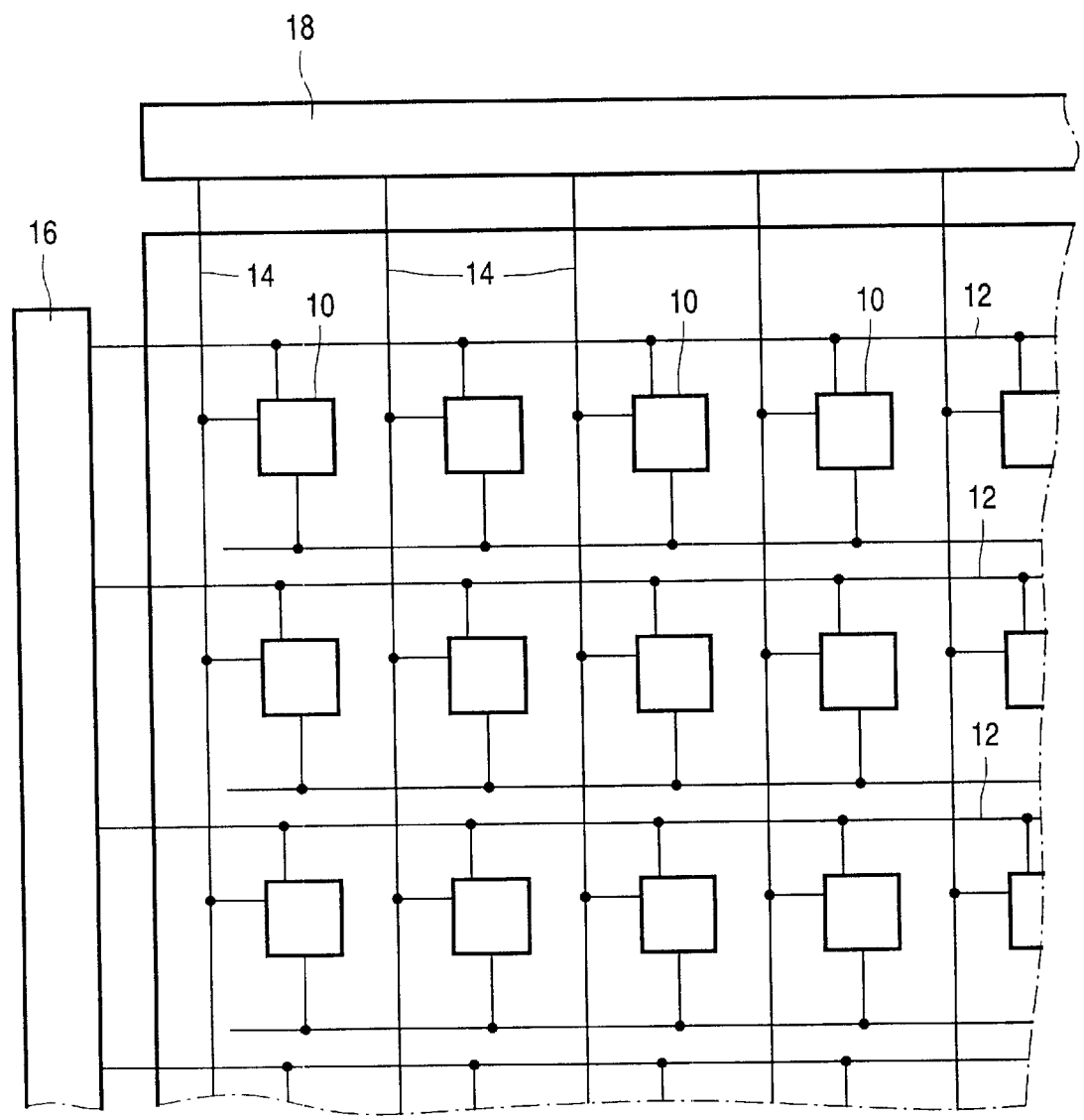
FIG. 1 is a simplified schematic diagram of part an embodiment of display device according to the invention.

Referring to FIG. 1, an active matrix addressed electroluminescent display device comprises a panel having a row and column matrix array of regularly-spaced pixels, denoted by the blocks 10 and comprising electroluminescent display elements together with associated switching means, located at the intersections between crossing sets of row (selection) and column (data) address conductors 12 and 14. Only a few pixels are shown in the Figure for simplicity. In practice there may be several hundred rows and columns of pixels. The pixels 10 are addressed via the sets of row and column address conductors by a peripheral drive circuit comprising a row, scanning, driver circuit 16 and a column, data, driver circuit 18 connected to the ends of the respective sets of conductors. The invention relates specifically to a current supply circuit suitable for use in the column driver circuit 18. However, the operation of a display device having current-driven pixels will first be described in more detail below.

Figure 2:
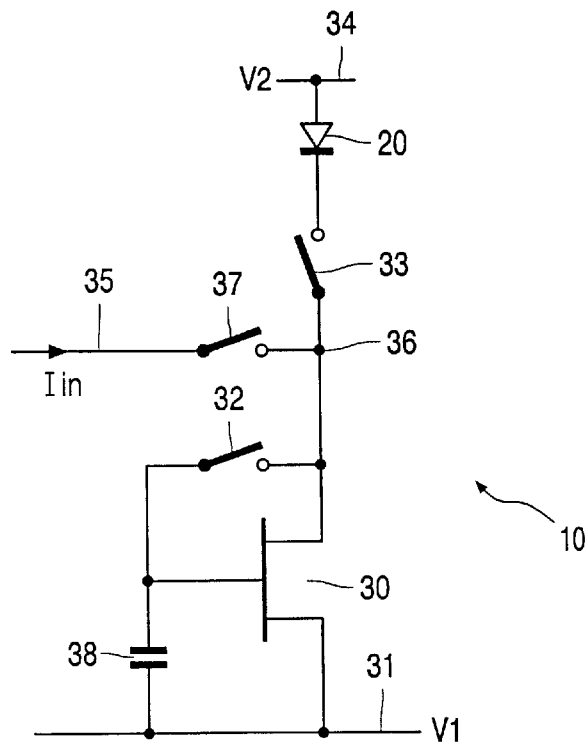
FIG. 2 shows in simple form the equivalent circuit of a typical pixel circuit comprising a display element and its associated control circuitry in the display device of FIG. 1.
Figure 3:
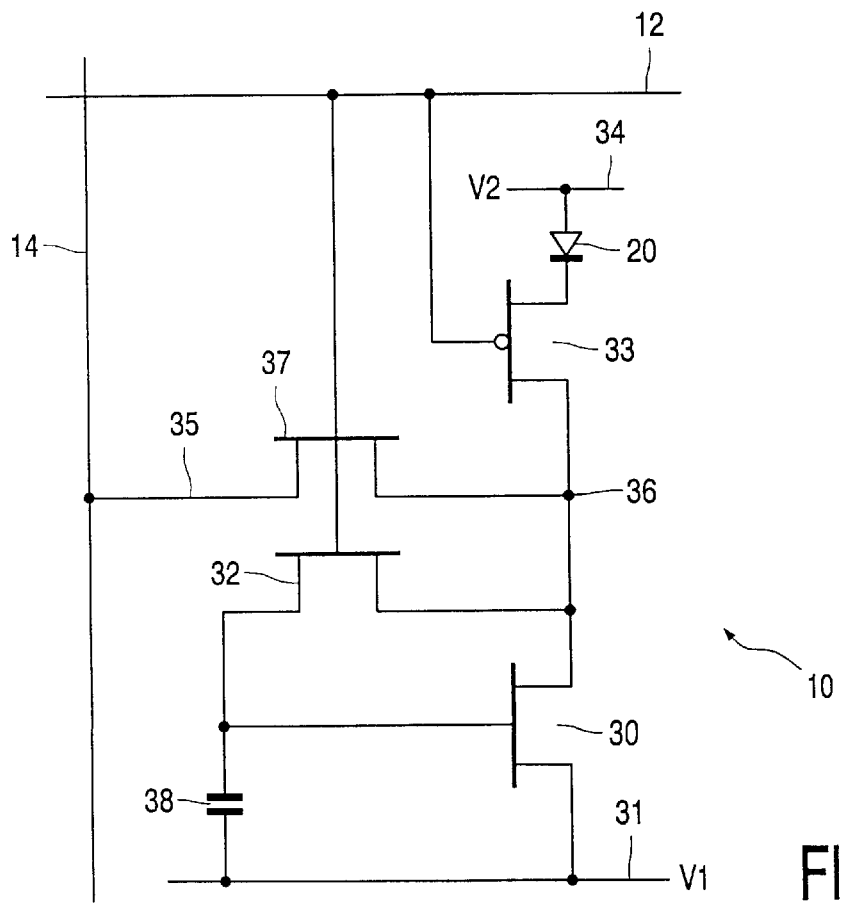
FIG. 3 illustrates a practical realisation of the pixel circuit of FIG. 2.

FIG. 2 shows in simplified schematic form the circuit of a typical pixel block 10 in the array and is intended to illustrate the basic manner of its operation. A practical implementation of the pixel circuit of FIG. 2 is illustrated in FIG. 3.

The electroluminescent display element, referenced at 20, comprises an organic light emitting diode, represented here as a diode element (LED) and comprising a pair of electrodes between which one or more active layers of organic electroluminescent material is sandwiched. The display elements of the array are carried together with the associated active matrix circuitry on one side of an insulating support. Either the cathodes or the anodes of the display elements are formed of transparent conductive material. The support is of transparent material such as glass and the electrodes of the display elements 20 closest to the substrate may consist of a transparent conductive material such as ITO so that light generated by the electroluminescent layer is transmitted through these electrodes and the support so as to be visible to a viewer at the other side of the support. Typically, the thickness of the organic electroluminescent material layer is between 100 nm and 200 nm. Typical examples of suitable organic electroluminescent materials which can be used for the elements 20 are described in EP-A-0 717446 to which reference is invited for further information and whose disclosure in this respect is incorporated herein. Electroluminescent materials such as conjugated polymer materials described in WO96/36959 can also be used.

Each display element 20 has an associated switch means which is connected to the row and column conductors 12 and 14 adjacent the display element and which is arranged to operate the display element in accordance with an applied analogue drive (data) signal level that determines the element's drive current, and hence light output. The display data signals are provided by the column driver circuit 18 which acts as a current source. This invention is directed specifically at the column driver circuit, described below.

A suitably processed video signal is supplied to this circuit 18 which samples the video signal and applies a current constituting a data signal related to the video information to each of the column conductors for the appropriate row addressed by the row driver circuit 16.

Referring to FIG. 2, the switch means comprises a drive transistor 30, more particularly a n-channel FET, whose source is connected to a supply line 31 and whose drain is connected, via a switch 33, to the cathode of the display element 20. The anode of the display element is connected to a second supply line 34, which in effect is constituted by a continuous electrode layer held at a fixed reference potential.

The gate of the transistor 30 is connected to the supply line 31, and hence the source electrode, via a storage capacitance 38 which may be a separately formed capacitor or the intrinsic gate-source capacitance of the transistor. The gate of the transistor 30 is also connected via a switch 32 to its drain terminal.

The transistor circuit operates in the manner of a single transistor current mirror with the same transistor performing both current sampling and current output functions and with the display element 20 acting as the load. An input to this current mirror circuit is provided by an input line 35 which connects to a node 36 between the switches 32 and 33, constituting an input terminal, via a further switch 37 which controls the application of an input signal to the node.

Operation of the circuit takes place in two phases. In a first, sampling, phase, corresponding in time to an addressing period, an input current signal for determining a required output from the display element is fed into the circuit and a consequential gate—source voltage on the transistor 30 is sampled and stored in the capacitance 38. In a subsequent, output, phase the transistor 30 operates to draw current through the display element 20 according to the level of the stored voltage so as to produce the required output from the display element, as determined by the input signal, which output is maintained for example until the display element is next addressed in a subsequent, new, sampling phase. During both phases it is assumed that the supply lines 31 and 34 are at appropriate, pre-set, potential levels, V1 and V2. The supply line 31 will normally be at ground potential (V1) and the supply line 34 will be at a positive potential (V2).

During the sampling phase, the switches 32 and 37 are closed, which diode—connects the transistor 30, and the switch 33 is open, which isolates the display element load. An input signal, corresponding to the required display element current and denoted here as Iin, is driven through the transistor 30 from an external source, e.g. the column driver circuit 18 in FIG. 1, via the input line 35, the closed switch 37 and the input terminal 36. Because the transistor 30 is diode—connected by virtue of the closed switch 32, the voltage across the capacitance 38 at the steady state condition will be the gate—source voltage that is required to drive a current Iin through the channel of the transistor 30. Having allowed sufficient time for this current to stabilise, the sampling phase is terminated upon the opening of the switches 32 and 37 isolating the input terminal 36 from the input line 35 and isolating the capacitance 38 so that the gate—source voltage, determined in accordance with the input signal Iin, is stored in the capacitance 38. The output phase then begins upon the closing of the switch 33 thus connecting the display element cathode to the drain of the transistor 30. The transistor 30 then operates as a current source and a current approximately equal to Iin is drawn through the display element 20.

The drive current for the display element may differ very slightly from the input current Iin because of capacitive coupling due to charge injection effects when switch 32 turns off causing a change in the voltage on capacitance 38 and also because the transistor 30 may not act as a perfect current source as in practice it is likely to have a finite output resistance. Because, however, the same transistor is used to sample Iin during the sampling phase and to generate the current during the output phase, the display element current is not dependent on the threshold voltage or the mobility of the transistor 30.

FIG. 3 shows a practical embodiment of the pixel circuit of FIG. 2 used in the display device of FIG. 1. In this, the switches 32, 33 and 37 are each constituted by transistors and these switching transistors, together with the drive transistor 30, are all formed as thin film field effect transistors, TFTs. The input line 35, and the corresponding input lines of all pixel circuits in the same column, are connected to a column address conductor 14 and through this to the column driver circuit 18. The gates of the transistors 32, 33 and 37, and likewise the gates of the corresponding transistors in pixel circuits in the same row, are all connected to the same row address conductor 12. The transistors 32 and 37 comprise n-channel devices and are turned on (closed) by means of a selection (scan) signal in the form of a voltage pulse applied to the row address conductor 12 by the row driver circuit 16. The transistor 33 is of opposite conductivity type, comprising a p-channel device, and operates in complementary fashion to the transistors 32 and 37 so that it turns off (opens) when the transistors 32 and 37 are closed in response to a selection signal on the conductor 12, and vice versa.

The supply line 31 extends as an electrode parallel to the row conductor 12 and is shared by all pixel circuits in the same row. The supply lines 31 of all rows can be connected together at their ends. The supply lines may instead extend in the column direction with each line then being shared by the display elements in a respective column. Alternatively, supply lines may be provided extending in both the row and column directions and interconnected to form a grid structure.

The array is driven a row at a time in turn with a selection signal being applied to each row conductor 12 in sequence. The duration of the selection signal determines a row address period, corresponding to the period of the aforementioned sampling phase. In synchronisation with the selection signals, appropriate input current drive signals, constituting data signals, are applied to the column conductors 14 by the column driver circuit 18 as required for a row at a time addressing so as to set all the display elements in a selected row to their required drive level simultaneously in a row address period with a respective input signals determining the required display outputs from the display elements. Following addressing of a row in this way, the next row of display elements is addressed in like manner. After all rows of display elements have been addressed in a field period the address sequence is repeated in subsequent field periods with the drive current for a given display element, and hence the output, being set in the respective row address period and maintained for a field period until the row of display elements concerned is next addressed.

Figure 4:
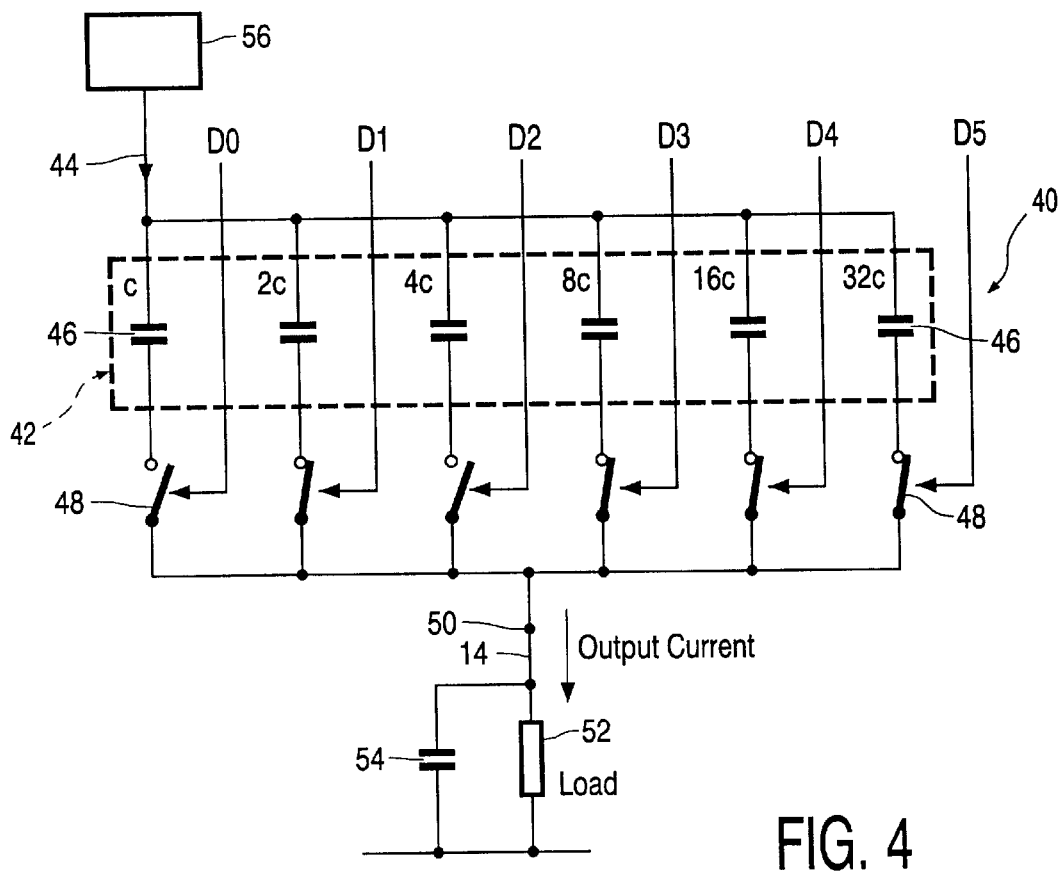
FIG. 4 illustrates one example of current supply circuit for use in the display device of FIG. 1.

FIG. 4 shows a first example of a current supply circuit for supplying the pixel current to one column 14 of the array shown in FIG. 1. The current supply circuit 40 forms part of the column driver circuitry 18, and one such current supply circuit 40 is provided for each column 14 of the array.

The circuit 40 essentially comprises a binary weighted capacitor network 42 having an input 44 to which a predetermined voltage function is applied. The network 42 comprises an array of capacitors 46 arranged in parallel and having binary weighted values. In the example shown in FIG. 4, there are six capacitors in the array, with values C, 2C, 4C, 8C, 16C and 32C. The value C is selected by considering the required output current, depending upon the pixel configuration and display element characteristics, and the acceptable range of the voltage ramp function. For a given peak value of output current, the range of the voltage ramp can be reduced by using larger capacitors.

Each capacitor 46 is connected in series with a respective switch 48, and the switches are connected together at an output 50 of the current supply circuit 40.

The weighted capacitor network 42 is controlled by a binary input word which controls the switching of the switches 48. The number of bits in the control word corresponds to the number of parallel capacitor-switch arrangements. Thus, in the example shown in FIG. 4, a six bit binary word comprising bits D0 to D5 is used to control the switches 48 of the network 42.

The operation of the circuit 40 is based on the principle that if a change in voltage is developed across a capacitor, then the current through the capacitor is given by the value of the capacitance multiplied by the derivative of the voltage with respect to time. If a signal is applied to the input 44 which gives rise to a known rate of change of voltage across each capacitor in the network 42, then the combined current flowing to the output 50 can be controlled accurately. The individual bits of the digital video data are used to control which capacitors receive the voltage signal from the input 44, which then determines the current output from the supply circuit 40, which depends upon the combined capacitance of the capacitors of the network 42 for which the associated switching device 48 is closed. In the configuration shown in FIG. 4, the capacitors 2C, 8C, 16C and 32C contribute to the current flowing to the output 50 of the current supply circuit 40.

In FIG. 4, the output load is represented as a resistance 52 in parallel with a capacitance 54, and this schematically represents the load presented by the column of the addressed pixel during the row address period. Thus, with reference to the pixel configuration shown in FIG. 2, the load comprises the capacitor 38 in parallel with the diode-connected transistor 30, as well as the two closed switches 32,37. The capacitance between the column electrode and the other electrodes within the display also contributes to (and in fact dominates) the overall column capacitance.

The voltage function at the input 44 of the current supply circuit 40 will determine the rate of change of voltage across each capacitor, and thereby determines the output current of the circuit. A circuit 56 is provided for generating an appropriate voltage function, and this circuit 56 can be shared between all current supply circuits 40 in the column driver circuitry 18.

Figure 5A:
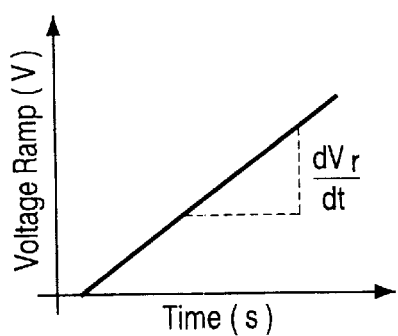
FIG. 5 shows voltage curves to explain the operation of the circuit of FIG. 4.
Figure 5B:
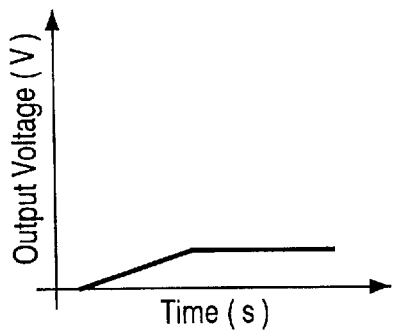
Figure 5C:
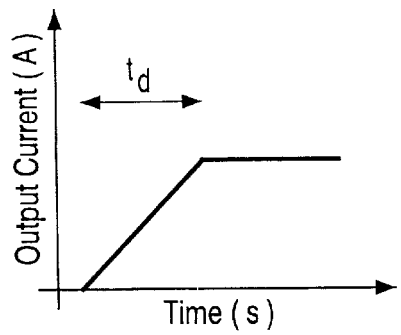

FIG. 5 shows one possible set of voltage waveforms used in the control of the circuit of FIG. 4. FIG. 5A shows the voltage function generated by the circuit 56 and applied to the input 44 of the current supply circuit 40. As shown, a voltage ramp function is applied at the input 44 which increases with a constant rate of change. When the voltage ramp begins, the change in voltage is initially transferred via the capacitors 46 whose associated switches 48 are closed onto the output 50 of the circuit and to the load 52, 54. During this initial time the voltage across the load, and indeed the voltage across the switching devices 48, begins to increase, and the output current of the current supply circuit 40 increases, following a function which is dependent upon the load connected to the circuit, and on the switching characteristics of the switches 48. This initial period $t_d$ is shown in FIG. C as linear, although this will not necessarily be the case. During this period the voltage at the output 50 is not constant, because capacitive elements in the display are charging. At a certain point of time, at the end of the period $t_d$ represented in FIG. 5C, the column voltage (shown in FIG. 5B) has increased to a point at which the output current of the supply circuit 40 becomes constant, and is determined solely by the slope of the voltage ramp of FIG. 5A. The values of the capacitors selected by the control word D0 to D5 determines the magnitude of this current. The constant output current of the converter is the sum of the capacitors selected multiplied by the slope of the voltage ramp. As the least significant bit of the control word is used to control the smallest capacitor C, and as the capacitor network is binary weighted, the constant output current is proportional to the value of the control word D0 to D5.

After the settling period $t_d$ there will be a constant voltage drop across the switches 48, and the voltage at the output 50 will also be a constant value as shown in FIG. 5B. For the pixel configuration of FIG. 2, this constant voltage takes into account the voltage drop across the switch 37 as well as the gate-source voltage of the transistor 30 which is connected as a diode. These voltages are all constant for a given input current, so that the rate of change of voltage appearing at the input 44 of the current supply circuit 40 appears solely across the capacitor array 42. The time delay before the constant output current is established depends on a number of factors including the electrical characteristics of the load, the initial output voltage, the value of the selected capacitors in the array 42 and the slope of the voltage ramp. However, once established, the output current is independent of the electrical characteristics of the various transistors in the circuit.

Figure 6:
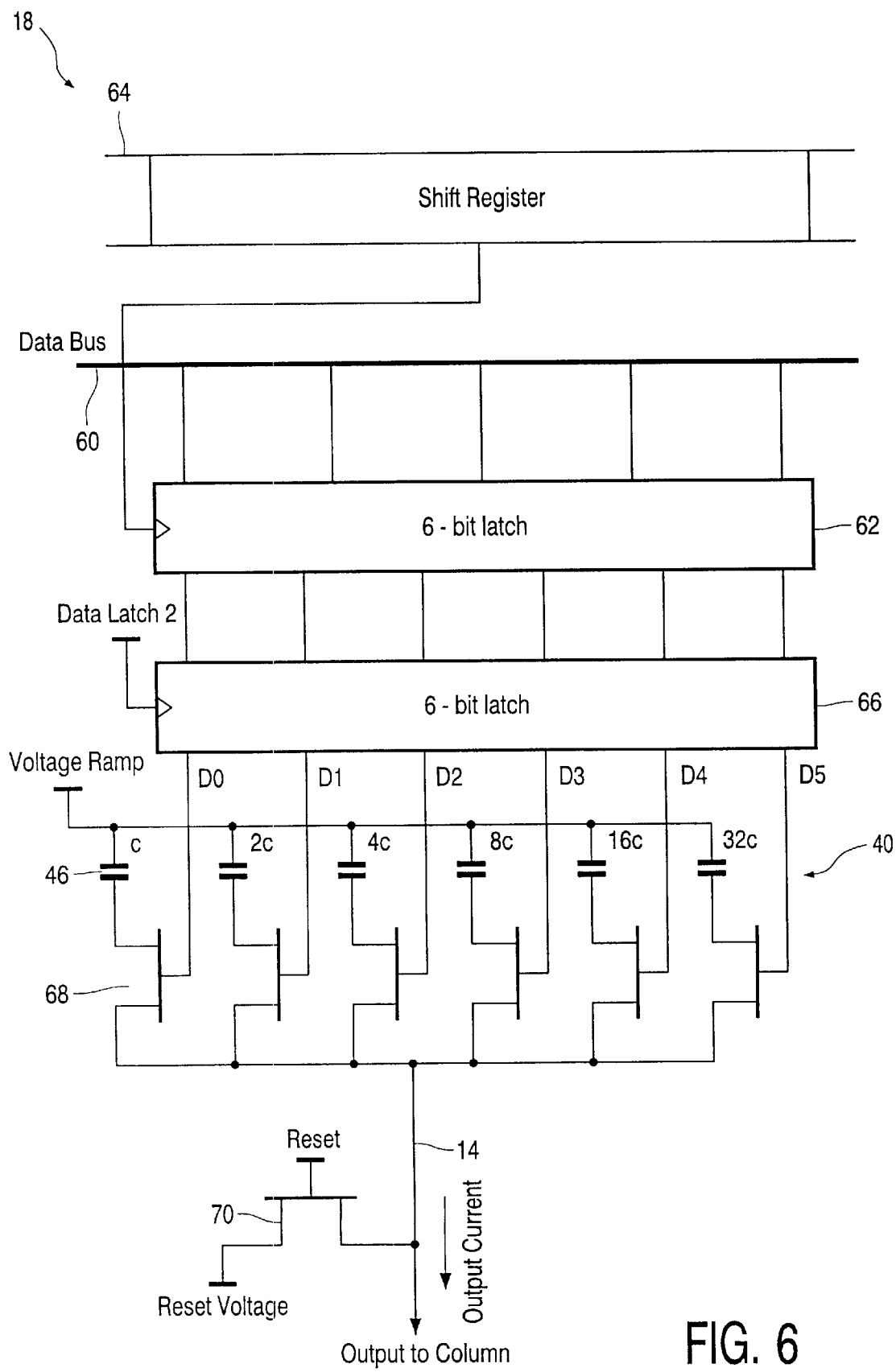
FIG. 6 illustrates the use of the circuit of FIG. 4 in a column driver circuit.

FIG. 6 illustrates how the current supply circuit 40 is implemented within a column driver circuit 18 of a display device. One section of the column driver circuit is shown for an individual column 14 of the array. Digital video data is applied to a data bus 60, and this data is latched in sequence into a first set of latches 62, one for each column of the array. A shift register 64 controls the latching operation. At the end of the video line period, the data is transferred from the first latch to a second latch 66 which supplies the digital control word D0 to D5 of the current supply circuit 40. The switches of the converter are implemented using n-channel thin film transistors 68, with the bits of the control word applied to the gates of these transistors. An additional transistor 70 is provided at the output of the current supply circuit 40, for resetting the voltage at the output of the circuit at the start of each conversion, and to establish the initial voltage across the capacitors 46 within the array 42.

Figure 7A:
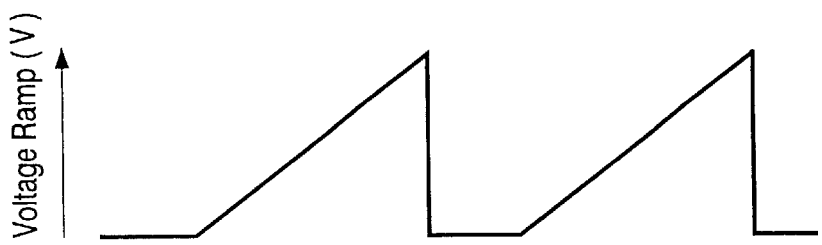
FIG. 7 shows voltage curves to explain the operation of the circuit of FIG. 6.
Figure 7B:
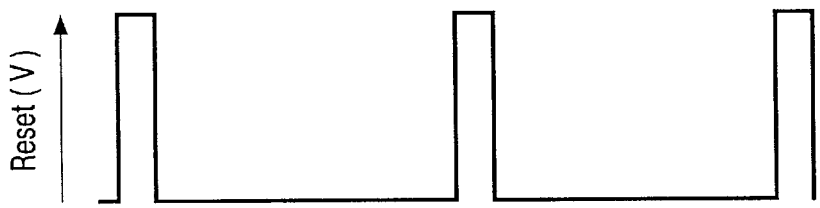
Figure 7C:
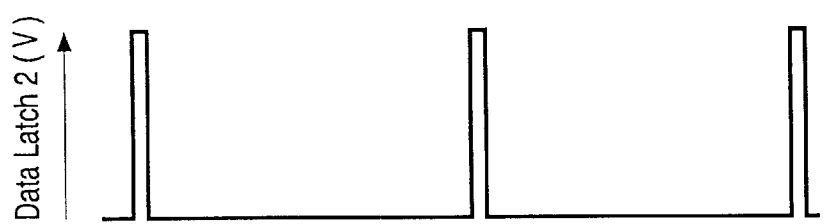
Figure 7D:
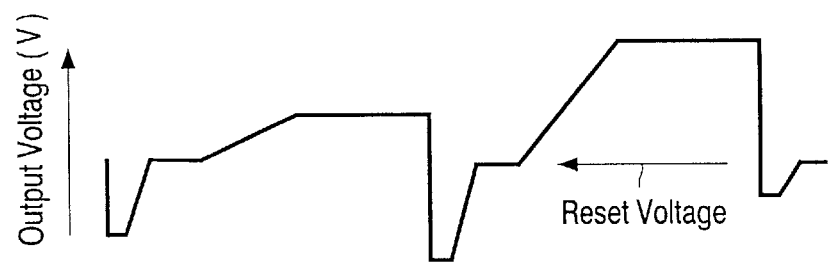
Figure 7E:
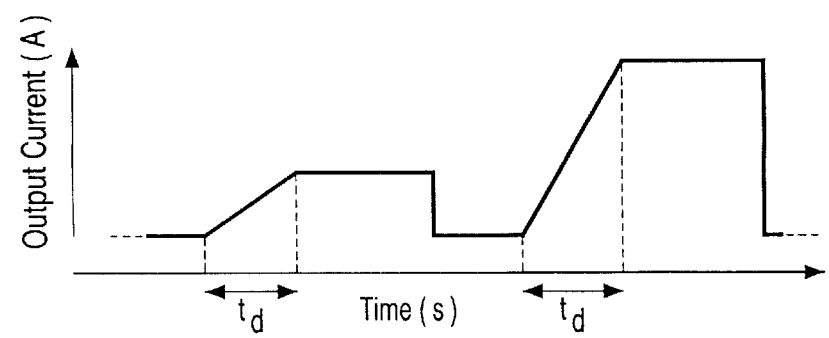

As shown in FIG. 7, the transfer of the control word from the latch 66 to the capacitor array (FIG. 7C), as well as the re-setting operation (FIG. 7B), immediately precede the beginning of the voltage ramp (FIG. 7A). The frame time for displaying a complete image may be of the order of 20 ms, which allows approximately 15 $\mu$s for the addressing of each row of the array. The output current must have stabilised by the end of the video line period, and consequently the settling time $t_d$ is of the order of 5–10 $\mu$s, corresponding to the time required for saturation of the transistors within the pixel circuit. As shown in FIG. 7E showing the output current, the settling time $t_d$ is substantially independent of the current level provided by the current supply circuit 40. FIG. 7D shows the column voltage during the cycle.

The amplitude of the required voltage ramp waveform depends on a number of factors, one being the time required to establish the correct current at the output of the current supply circuit 40. This time may become large if, for example, the effective capacitance of the pixel arrangement is high. In order to avoid the need for a large voltage ramp amplitude, the output current of the circuit 40 can be sampled and used to control a current source. The circuit of FIG. 8 includes an additional arrangement for this purpose. In this case, the output 50 of the current supply circuit 40 drives the input of a current sampling circuit comprising four transistors T2, T3, T4 and T5.

During the first part of the video line period, the transistors T2 and T3 are turned on by a sampling line connected to the gates of T2 and T3, and the current supply circuit 40 is operated. The output current from the supply circuit 40 passes through the transistor T4 and by virtue of the connection provided by T3, the gate voltage of T4 settles at the value required to maintain this current. This gate voltage is stored on a capacitor 72. Once the voltage on the gate of T4 has settled, T2 and T3 are turned off using the sample line, to isolate the capacitor 72, which thus holds the required gate voltage. T5 is then turned on by an output enable line. Transistor T4 now acts as a current source and the current is drawn from the column 14 which is equal to the output current from the circuit 40. Once the output current of the circuit 40 has been sampled, the voltage ramp waveform can be stopped, therefore allowing its amplitude to be limited.

The current at the column drive output can be maintained for as long as the voltage is held on the gate of T4 by the capacitor 72.

Figure 8:
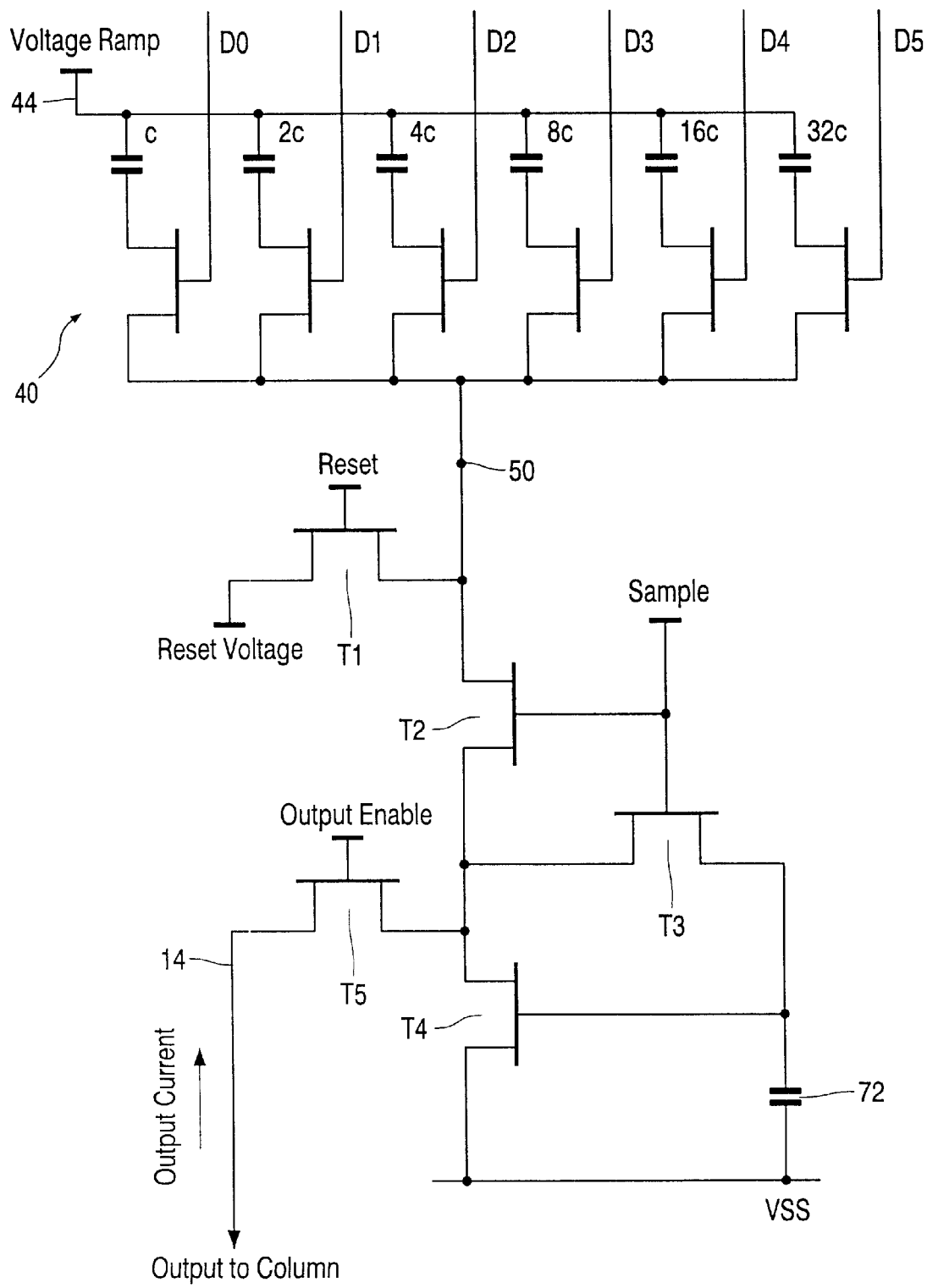
FIG. 8 illustrates an alternative use of the circuit of FIG. 4 in a column driver circuit.
Figure 9A:
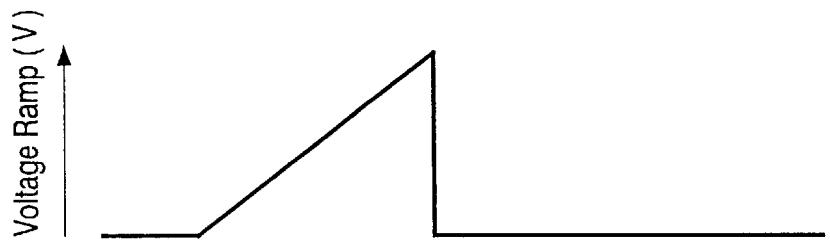
FIG. 9 shows voltage curves to explain the operation of the circuit of FIG. 8.
Figure 9B:
Figure 9C:
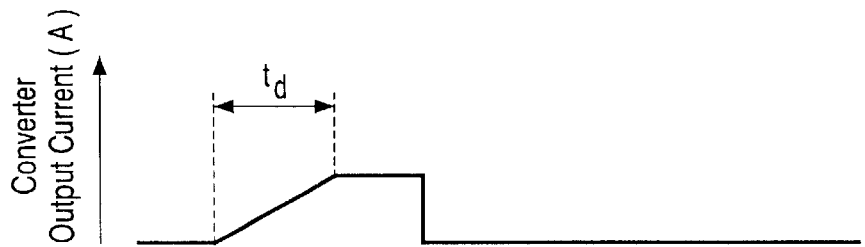
Figure 9D:
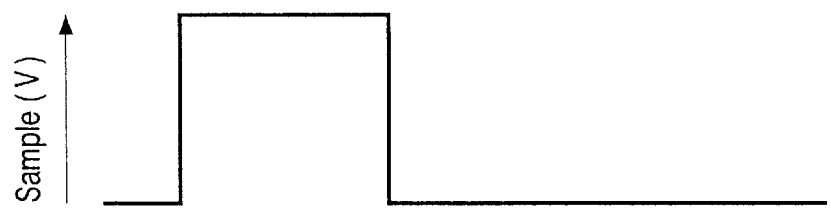
Figure 9E:
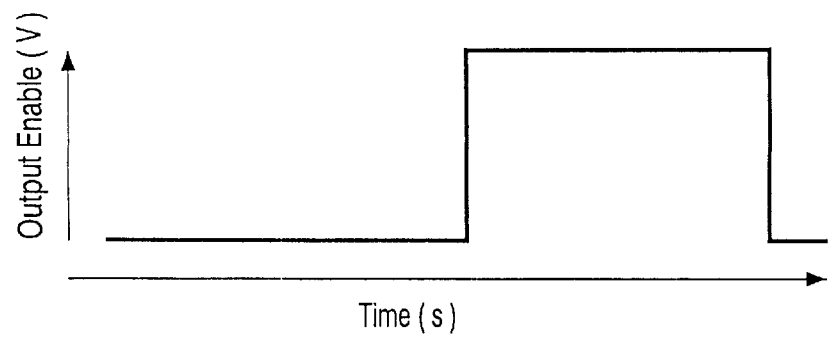

FIG. 9 shows various voltage waveforms for the operation of the circuit of FIG. 8 as described above. FIG. 9A shows the ramped input voltage 44, FIG. 9B shows the reset pulse and FIG. 9C shows the output current. Whilst the output current is stabilising, for the settling time td and slightly beyond, the sample line (FIG. 9D) is at a high voltage to turn on transistors T2 and T3, and thereby charge the capacitor 72 to the gate voltage. Subsequently, the output enable line is turned on (FIG. 9E), so that the sampling circuit T2, T3, T4, T5 supplies the output current rather than the current supply circuit 40. Thus, the voltage ramp (FIG. 9A) is stopped and the current supply circuit 40 no longer supplies any output.

Figure 10:
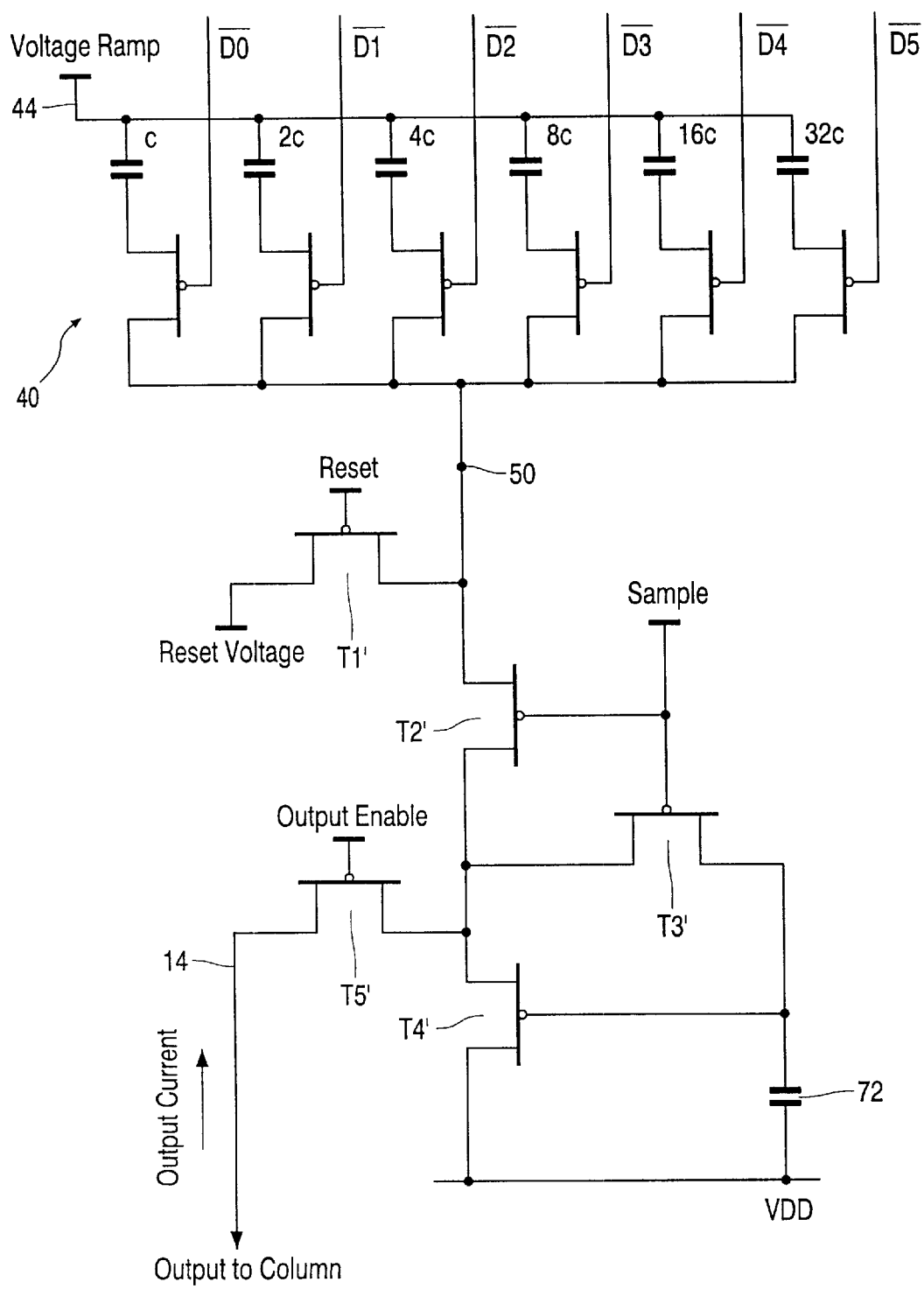
FIG. 10 illustrates another alternative use of the circuit of FIG. 4 in a column driver circuit.
Figure 11A:
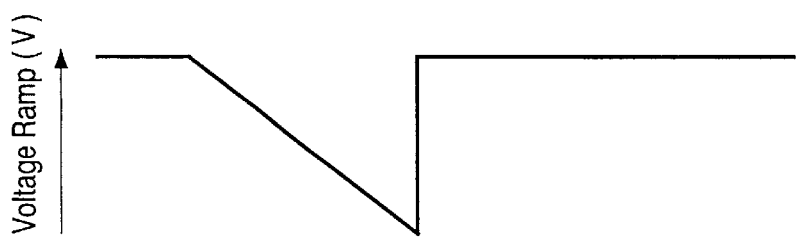
FIG. 11 shows voltage curves to explain the operation of the circuit of FIG. 10.
Figure 11B:
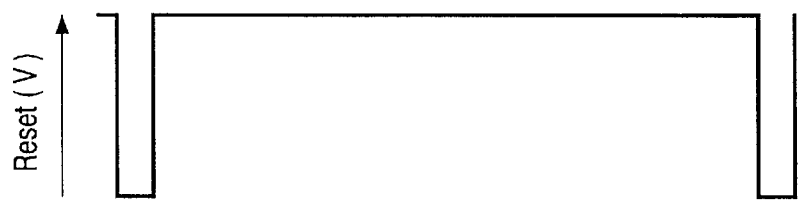
Figure 11C:
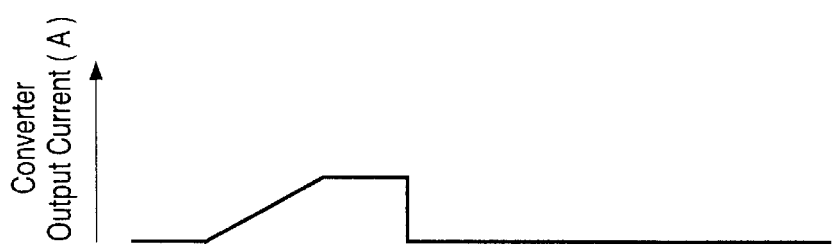
Figure 11D:
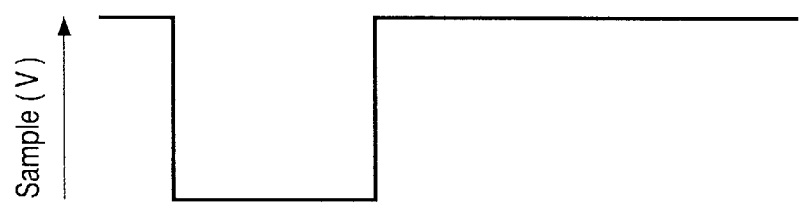
Figure 11E:
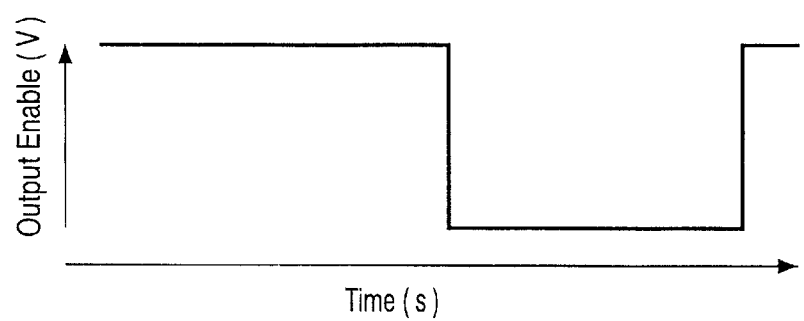

The circuit of FIG. 8 thus acts as a current sink, whereas the circuit of FIG. 6 acts as a current source. If a current source type circuit is required with sampling of the output of the current supply circuit 40, the arrangement shown in FIG. 10 may alternatively be used. In this circuit, the operation of the current supply circuit 40 has be altered so that it acts as a current sink rather than a current source. All transistors T1 to T5 have been replaced with opposite channel transistors T1' to T5', and the operation of the circuit will be apparent to those skilled in the art from the above description. FIG. 11 shows waveforms corresponding to those in FIG. 9 but for the circuit of FIG. 10.

In the description above, a linear voltage ramp waveform has been shown. It is also possible to apply a non-linear voltage waveform to the capacitors in the current supply circuit 40, in which case the output current will vary with the slope of the non-linear waveform, and could therefore be modulated with time.

The column driver circuit may be used for other pixel configurations, and two further examples are given below.

The pixel circuit of FIG. 3 requires the use of both n and p channel transistors which can complicate the fabrication process. Moreover, this particular circuit requires four transistors and a common electrode whose provision may reduce the effective aperture of the pixel.

Figure 12:
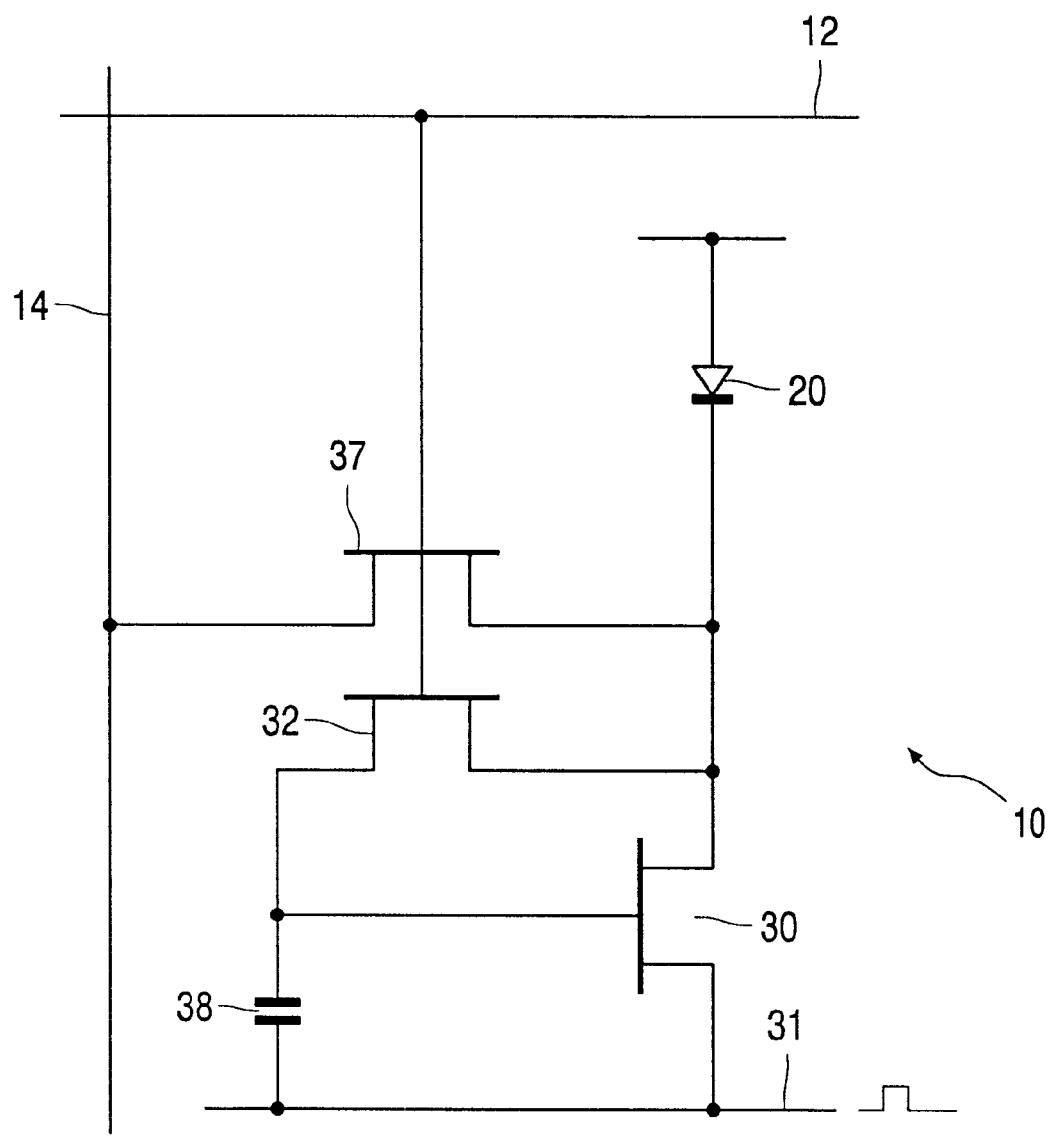
FIG. 12 shows a modified form the pixel circuit.

FIG. 12 illustrates an alternative, modified, form of pixel circuit which avoids the need to use an opposite polarity type transistor. In this circuit the transistor 33 is removed and the input terminal 36 is connected directly to the display element 20. As with the previous circuit there are two phases, sampling and output, in the operation of the current mirror. During the sampling phase, the switching transistors 32 and 37 are closed, through a selection pulse on the associated row conductor 12, which diode—connects the transistor 30. At the same time the supply line 31 is supplied with a positive voltage pulse, rather than remaining at a constant reference potential as before, so that the display element 20 is reverse—biased. In this state, no current can flow through the display element 20 (ignoring small reverse leakage currents) and the drain current of the transistor 30 is equal to the input current Iin. In this way, the appropriate gate—source voltage of the transistor 30 is again sampled on the capacitance 38. At the end of the sampling phase, the switching transistors 32 and 37 are turned off (opened) as before and the supply line 31 is returned to its normal level, typically 0V. In the subsequent, output, phase, the transistor 30 operates as before as a current source drawing current through the display element at a level determined by the voltage stored on the capacitor 38.

In the embodiment of FIG. 12, a supply line 31 connected separately to a potential source may be provided for each row of pixels. During a sampling phase the display elements in the row being addressed are turned off (as a result of pulsing the supply line 31) and if there is effectively only one common supply line in the array which is common to all pixel circuits, i.e. the supply line 31 of one row is part of a continuous line interconnecting all rows of pixel circuits, then all the display elements would be turned off during each sampling phase irrespective of which row is being addressed. This would reduce the duty cycle (the ratio of ON to OFF times) for a display element. Thus, it may be desirable for the supply line 31 associated with a row to be kept separate from the supply lines associated with other rows.

Various other pixel configurations are also possible, as will be apparent to those skilled in the art.

Although the above embodiments have been described with reference to organic electroluminescent display elements in particular, it will be appreciated that other kinds of electroluminescent display elements comprising electroluminescent material through which current is passed to generate light output may be used instead.

The display device may be a monochrome or multi-colour display device. It will be appreciated that a colour display device may be provided by using different light colour emitting display elements in the array. The different colour emitting display elements may typically be provided in a regular, repeating pattern of, for example, red, green and blue colour light emitting display elements.

What is claimed is:

1. A display device comprising:
   an array of pixels arranged in rows and columns, each pixel comprising a current-driven display element;
   driver circuitry for generating signal currents corresponding to desired outputs from the display elements,
   characterised in that the driver circuitry comprises means for generating a predetermined voltage function, the voltage function being supplied to the input of a binary weighted capacitor network, each capacitor of the network being connected in series with a respective switching transistor, an input word to the driver circuitry controlling the switching of the switching transistors, such that the output current of the driver circuitry is a function of the voltage function and of the combined capacitance of the capacitors of the network for which the associated switching transistor is closed, the output current being supplied to a selected pixel of the array.

2. The display device as claimed in claim 1, wherein the voltage function comprises a ramp function.

3. The display device as claim 1, further comprising row addressing circuitry for addressing rows of the array in turn, and wherein the driver circuitry comprises a binary weighted capacitor network for each column of the array, and provides a respective signal current to each column during a row addressing period.

4. The display as claim 1, wherein each pixel comprises an electroluminescent display element.

5. The display as claimed in claim 4, wherein each pixel comprises first and second switching means, and being operable in a first mode in which the input current is supplied by the first switching means to the second switching means, a control level being stored for the second switching means corresponding to the input current, and in a second mode in which the stored control level is applied to the second switching means so as to drive a current corresponding to the input current through the display element.

6. The display as claimed in claim 5, wherein the second switching means comprises a TFT, and wherein the gate-source voltage of the TFT at an operating point in which the source-drain current is the input current is stored on a capacitor as the control level.

7. The display as claim 1, wherein the output current is sampled to control a current source, which supplies the current to the selected pixel of the array.

8. A current source for providing a current output based on a binary input control word, comprising:

a binary weighted capacitor network;

means for generating a predetermined voltage function, the voltage function being supplied to the input of the binary weighted capacitor network, wherein each capacitor of the network is connected in series with a respective switching transistor, the binary input word controlling the switching of the switching transistors, such that the output current of the driver circuitry is a function of the voltage function and of the combined capacitance of the capacitors of the network for which the associated switching transistor is closed, the output current being supplied to an output of the current source.

* * * * *